(12) United States Patent
Hekmatshoartabari et al.

(10) Patent No.: US 10,692,716 B2
(45) Date of Patent: *Jun. 23, 2020

(54) SELF-ALIGNED SPACERLESS THIN FILM TRANSISTOR

(71) Applicant: International Business Machines Corporation, Armonk, NY (US)

(72) Inventors: Bahman Hekmatshoartabari, White Plains, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,723

(22) Filed: May 24, 2019

(65) Prior Publication Data

US 2019/0280128 A1 Sep. 12, 2019

Related U.S. Application Data

(63) Continuation of application No. 15/909,547, filed on Mar. 1, 2018.

(51) Int. Cl.
*H01L 21/02* (2006.01)
*H01L 29/66* (2006.01)
(Continued)

(52) U.S. Cl.
CPC .... *H01L 21/02211* (2013.01); *H01L 21/0217* (2013.01); *H01L 21/0274* (2013.01);
(Continued)

(58) Field of Classification Search
CPC .............. H01L 21/3003–3006; H01L 29/78618–2029/7863
See application file for complete search history.

(56) References Cited

U.S. PATENT DOCUMENTS 4,587,720 A 5/1986 Chenevas-Paule et al.
5,923,967 A 7/1999 Yamamoto
(Continued)

FOREIGN PATENT DOCUMENTS

JP S60211982 A 10/1985
KR 20000018592 A 4/2000
(Continued)

OTHER PUBLICATIONS

List of IBM Patents or Patent Applications Treated as Related; Date Filed: May 24, 2019, 2 pages.
(Continued)

*Primary Examiner* — Amar Movva
(74) *Attorney, Agent, or Firm* — Cantor Colburn LLP; Vazken Alexanian

(57) ABSTRACT

Embodiments of the invention are directed to a method of forming a semiconductor device. A non-limiting example of the method includes forming a semiconductor layer within or on a portion of a substrate, wherein the semiconductor layer includes a first type of semiconductor material. A gate stack is formed over a first exposed surface of the semiconductor layer. A first hydrogenated and doped semiconductor layer is formed over a second exposed surface of the semiconductor layer. A second hydrogenated and doped semiconductor layer is formed over a third exposed surface of the semiconductor layer, wherein a lateral dimension of the first hydrogenated and doped semiconductor layer terminates at a first sidewall of the gate stack, and wherein a lateral dimension of the second hydrogenated and doped semiconductor layer terminates at a second sidewall of the gate stack.

19 Claims, 8 Drawing Sheets

(51) Int. Cl.
  *H01L 21/027* (2006.01)
  *H01L 21/28* (2006.01)
  *H01L 21/30* (2006.01)
  *H01L 29/45* (2006.01)
  *H01L 29/786* (2006.01)

(52) U.S. Cl.
  CPC .. *H01L 21/02238* (2013.01); *H01L 21/02255* (2013.01); *H01L 21/02271* (2013.01); *H01L 21/02365* (2013.01); *H01L 21/28052* (2013.01); *H01L 21/28176* (2013.01); *H01L 21/28211* (2013.01); *H01L 21/3003* (2013.01); *H01L 29/458* (2013.01); *H01L 29/6659* (2013.01); *H01L 29/66628* (2013.01); *H01L 29/66757* (2013.01); *H01L 29/66772* (2013.01); *H01L 29/78618* (2013.01); *H01L 29/78654* (2013.01); *H01L 29/78675* (2013.01); *H01L 29/665* (2013.01)

(56) References Cited

U.S. PATENT DOCUMENTS

| | | | |
|---|---|---|---|
| 5,972,765 | A | 10/1999 | Clark et al. |
| 6,566,687 | B2 | 5/2003 | Andry et al. |
| 7,151,033 | B2 | 12/2006 | Oyu et al. |
| 2013/0307075 | A1* | 11/2013 | Hekmatshoar-Tabari ............. H01L 29/78654 257/347 |
| 2019/0273165 | A1 | 9/2019 | Hekmatshoartabari et al. |

FOREIGN PATENT DOCUMENTS

| | | |
|---|---|---|
| KR | 100304911 B1 | 7/2001 |
| WO | 2014071634 A1 | 5/2014 |

OTHER PUBLICATIONS

Shatujerdi et al., "Low-Temperature Epitaxy of Compressively Strained Silicon Directly on Silicon Substrates," Journal of Electronic Materials 41.3, 2012, pp. 494-497.

Valletta et al., "Kink effect in short-channel polycrystalline silicon thin-film transistors," Applied Physics Letters 85.15, 2004, pp. 3113-3115.

List of IBM Patents or Patent Applications Treated as Related; Date Filed: Jan. 2, 2020, 2 pages.

* cited by examiner

SELF-ALIGNED SPACERLESS THIN FILM TRANSISTOR

DOMESTIC PRIORITY

This application is a continuation of U.S. patent application Ser. No. 15/909,547, filed Mar. 1, 2018, the disclosure of which is incorporated by reference herein in its entirety.

BACKGROUND

The present invention relates in general to semiconductor devices for use in integrated circuits (ICs). More specifically, the present invention relates to improved fabrication methodologies and resulting structures for a self-aligned, spacerless thin-film transistor (TFT).

Metal oxide semiconductor field effect transistors (MOSFETs) include a source and a drain that are formed in the active region of a semiconductor layer by implanting n-type or p-type impurities in the semiconductor layer. A conventional geometry for MOSTFETs is known as a "planar" geometry because the various parts of the MOSFET device are laid down as planes or layers.

A TFT is a type of FET that can be fabricated by depositing thin films of an active semiconductor layer, dielectric layers, metallic gates, and metallic contacts. A "thin-film" layer's thickness can range from fractions of a nanometer to several micrometers. Faster TFTs can be achieved by using, for example, low temperature polycrystalline silicon (LTPS) or transparent semiconducting oxides (TSOs), thereby potentially expanding TFT application to gate and data drivers or even full systems-on-panel. TFTs can be formed on bulk semiconductor substrates or on semiconductor-on-insulator (SOI) substrates. When bulk semiconductors are used, isolation is provided by implanted wells filled with shallow trench isolation (STI) regions that separate one TFT from another. When SOI is used, TFTs are formed in the semiconductor layer, and no wells are needed because of the isolating material that is already present in the SOI substrate. For liquid-crystal display (LCD) applications, a common non-conductive TFT SOI insulator is glass. This differs from the conventional MOSFET, wherein the insulator of an SOI substrate is typically a dielectric material such as an oxide.

SUMMARY

Embodiments of the invention are directed to a method of forming a semiconductor device. A non-limiting example of the method includes forming a semiconductor layer within or on a portion of a substrate, wherein the semiconductor layer includes a first type of semiconductor material. A gate stack is formed over a first exposed surface of the semiconductor layer. A first hydrogenated and doped semiconductor layer is formed over a second exposed surface of the semiconductor layer. A second hydrogenated and doped semiconductor layer is formed over a third exposed surface of the semiconductor layer, wherein a lateral dimension of the first hydrogenated and doped semiconductor layer terminates at a first sidewall of the gate stack, and wherein a lateral dimension of the second hydrogenated and doped semiconductor layer terminates at a second sidewall of the gate stack.

Embodiments of the invention are directed to a method of forming a thin-film transistor (TFT) device. A non-limiting example of the invention includes forming a semiconductor layer within or on a portion of a substrate, wherein the semiconductor layer includes a first type of crystalline semiconductor material. A gate stack is formed over a first exposed surface of the semiconductor layer, wherein the gate stack comprises a dielectric layer and a gate metal layer. A first hydrogenated and doped semiconductor layer is formed over a second exposed surface of the semiconductor layer. A second hydrogenated and doped semiconductor layer is formed over a third exposed surface of the semiconductor layer, wherein a source region of the TFT device includes the first hydrogenated and doped semiconductor layer, along with a first portion of the semiconductor layer that is under the first hydrogenated and doped semiconductor layer. A drain region of the TFT device includes the second hydrogenated and doped semiconductor layer, along with a second portion of the semiconductor layer that is under the second hydrogenated and doped semiconductor layer. A channel region of the TFT device includes a third portion of the semiconductor layer that is under the gate stack. A lateral dimension of the first hydrogenated and doped semiconductor layer terminates at a first sidewall of the gate stack, and a lateral dimension of the second hydrogenated and doped semiconductor layer terminates at a second sidewall of the gate stack.

Embodiments of the invention are directed to a semiconductor device. A non-limiting example of the semiconductor device includes a semiconductor layer formed within or on a portion of a substrate, wherein the semiconductor layer includes a first type of semiconductor material. A gate stack is formed over a first surface of the semiconductor layer. A first hydrogenated and doped semiconductor layer is formed over a second surface of the semiconductor layer. A second hydrogenated and doped semiconductor layer is formed over a third surface of the semiconductor layer, wherein a lateral dimension of the first hydrogenated and doped semiconductor layer terminates at a first sidewall of the gate stack. A lateral dimension of the second hydrogenated and doped semiconductor layer terminates at a second sidewall of the gate stack. The substrate is selected from a group consisting of a bulk semiconductor and semiconductor-on-insulator (SOI).

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 5A-9 each depict a cross-sectional view of a TFT device after a fabrication stage according to embodiments of the invention in which:

FIG. 5A depicts a cross-sectional view of a self-aligned, spacerless TFT after fabrication operations according to embodiments of the invention;

FIG. 6 depicts a cross-sectional view of a self-aligned, spacerless TFT after fabrication operations according to embodiments of the invention;

FIG. 7 depicts a cross-sectional view of a self-aligned, spacerless TFT after fabrication operations according to embodiments of the invention;

FIG. 8 depicts a cross-sectional view of a self-aligned, spacerless TFT after fabrication operations according to embodiments of the invention; and FIG. 9 depicts a cross-sectional view of a self-aligned, spacerless TFT after fabrication operations according to embodiments of the invention;

DETAILED DESCRIPTION

Figure 1:
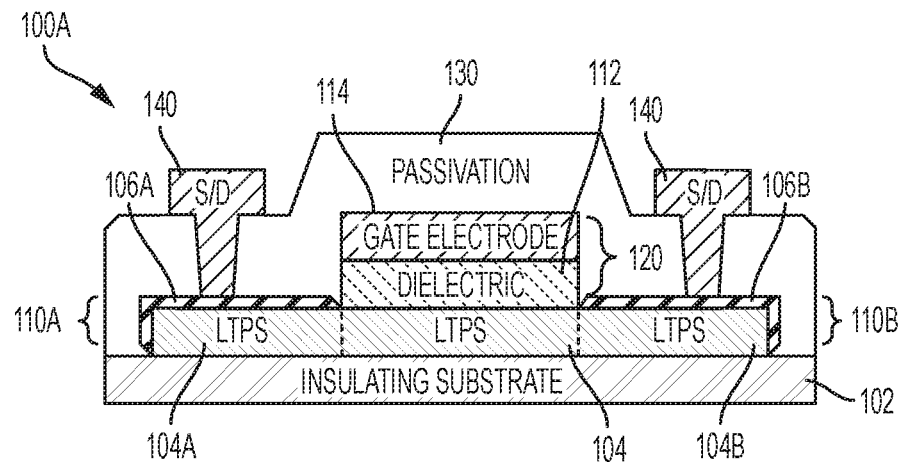
FIG. 1 depicts a cross-sectional view of a self-aligned, spacerless thin-film transistor (TFT) according to embodiments of the invention.

It is understood in advance that, although this detailed description includes illustrations and descriptions of TFTs having particular device configurations, implementation of the teachings recited herein are not limited to a particular type of TFT structure or combination of semiconductor materials. Rather, embodiments of the present invention are capable of being implemented in conjunction with any other type of TFT device or semiconductor material, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, a TFT is a type of FET having three terminals (gate, source, and drain) and including semiconductor, dielectric, conductive, and substrate layers. In a conventional TFT configuration, the semiconductor is placed between source/drain electrodes, and the dielectric is located between the gate electrode and the semiconductor. In this TFT configuration, the current between drain and source ($I_{DS}$) is controlled by varying the potential between gate and source ($V_{GS}$), thus inducing free charge accumulation at the dielectric/semiconductor interface. TFTs can be made using a wide variety of semiconductor materials such as Si, SiGe, Ge, GaAs, and the like. The characteristics of a semiconductor-based TFT depend on the crystalline state of the semiconductor. For example, where the semiconductor material is silicon, examples of silicon crystalline states include amorphous silicon, microcrystalline silicon, and/or poly-silicon. The semiconductor layer is disposed on an insulating substrate which can include glass, plastic, dielectric-coated metal foil, or a buried insulator, e.g. of a semiconductor-on-insulator (SOI) substrate.

TFTs are focused on large area and low processing temperatures (e.g., from about room-temperature to about 700° C., and more typically from about 150° C. to about 450° C.). In contrast, MOSFETs are focused on high transistor performance at the cost of a considerably larger processing temperature (e.g., from about 600° C. to 1200° C.). In MOSFETs, the substrate and the current path (source-channel-drain) can be formed either from a bulk semiconductor material such as silicon or from the semiconductor material of an SOI substrate. However, typical TFTs are only implanted in SOI configurations, with the insulator being either an insulating substrate (such as glass) or a buried insulator layer disposed on a carrier substrate.

TFTs are often used as the switching and driving elements for the pixels of active-matrix flat panel displays (AMFPDs) and handheld electronic devices. Compared to passive-matrix displays, which lack TFTs in the pixels, active-matrix displays can enable higher resolution, faster response time, higher brightness and better color saturation, which results in higher image and video quality. In addition, active-matrix displays are beneficial in reducing power consumption.

So-called "self-aligned" TFT structures can reduce both the TFT footprint and the TFT drain electric field. Reducing the TFT footprint can enable smaller pixel size and therefore higher display resolution. The use of lightly-doped drain (LDD) structures in a TFT can also reduce the drain electric field. It is desirable to keep the electric field low close to the drain in order to reduce the so-called "kink effect." The phrase "kink effect" refers to an undesirable "kink", or a break, in the curve that plots drain/source current ($I_{DS}$) as a function of gate voltage ($V_G$).

Similar to other FET devices, the source and the drain of a TFT device can be formed in an active region of a semiconductor layer by implanting n-type or p-type impurities in the layer of semiconductor material. The formation of conventional source/drain and LDD structures requires some form of an ion-implantation operation, which is an expensive and potentially destructive doping process. Although ion implantation provides some benefits, it requires countermeasures to address the damage caused by accelerated ions to the substrate lattice structure, thus adding complexity and expense to the fabrication process. In addition, activation of implanted doping either requires high-temperatures or activation by laser treatment. High dopant activation temperatures can result in unwanted dopant diffusion and can require the use of expensive high-temperature glass substrates. Activation by laser treatment introduces controllability issues particularly at high doping levels close to the solid solubility limit. A complicated and expensive combination of thermal annealing and laser treatment is often used. Moreover, known techniques for lowering the series resistance and reducing the footprint of known TFT configurations require the use of spacers for LDD formation, which make it difficult to maintain the required uniformity in certain critical device dimensions over large areas.

Turning now to an overview of aspects of the present invention, embodiments of the invention provide improved fabrication methodologies and resulting structures for a self-aligned, spacerless TFT devices. The novel structures and fabrication methods leverage the low-temperature epitaxial growth of hydrogenated crystalline silicon (c-Si:H) to form self-aligned source/drain regions. The disclosed structures and fabrication methods eliminate the need for expensive and complicated implantation and activation steps and also substantially reduce the high temperature requirements associated with ion implantation processes. In embodiments of the invention, low-temperature epitaxial growth can be performed using plasma-enhanced chemical vapor deposition (PECVD) at temperatures below about 450° C. In some embodiments of the invention, low-temperature epitaxial growth can be performed using PECVD at temperatures between about 150° C. and about 350° C. By using the low growth temperatures described herein, the TFT source/drain (S/D) regions can be fabricated with essentially no doping diffusion, which enables substantially self-aligned TFT structures (e.g., self-aligned S/D regions) to be fabricated without the use of spacers.

Turning now to a more detailed description of aspects of the present invention, FIGS. 1-4 depict various example configurations of self-aligned, spacerless TFT devices 100A, 100B, 100C, 100D according to embodiments of the invention. More specifically, FIG. 1 depicts a cross-sectional view of the self-aligned, spacerless TFT device 100A having an insulating substrate 102, a low temperature poly silicon (LTPS) channel region 104, source/drain (S/D) regions 110A, 110B, a gate stack 120, a passivation region 130, and S/D contacts 140, configured and arranged as shown. In embodiments of the invention, the S/D regions 110A, 110B include LTPS S/D regions 104A, 104B and S/D raised layers 106A, 106B, configured and arranged as shown. In embodiments of the invention, the gate stack 120 includes a gate dielectric region 112 and a conducting gate electrode region 114, configured and arranged as shown. In operation of the TFT device 100A, the current ($I_{DS}$) from the drain (e.g., S/D region 110A) through the LTPS channel region 104 to the source (e.g., S/D region 110B) is controlled by varying the potential ($V_{GS}$) between the gate stack 120 and the source (e.g., S/D region 110B), thus inducing free charge accumulation at the interface between the gate dielectric region 112 and the LTPS channel region 104.

In the TFT device 100A, a SOI TFT configuration is used, wherein LTPS regions (e.g., LTPS S/D region 104A, LTPS channel region 104, LTPS S/D region 104B) are formed over the insulating substrate 102. In embodiments of the invention, the insulating substrate 102 can be glass, plastic, buried oxide, and the like. In some embodiments of the invention, the substrate 102 can be a bulk monocrystalline silicon substrate, an extremely thin SOI (ETSOI) substrate, a partially-depleted SOI (PDSOI) substrate or other suitable substrates. In addition to silicon, suitable semiconductor and/or substrate materials include Ge, III-V semiconductors (e.g., GaAs), and the like. The gate dielectric region 112 can be formed from an insulator (e.g., an oxide), and the conducting gate electrode region 114 can be formed from a conductor (e.g., metal or doped polysilicon). Other gate structures and materials can also be employed. The passivation region 130 can be formed from a dielectric material such as silicon nitride.

The S/D contacts 140 are formed in ohmic contact with electrically-active areas of the TFT device 100A, specifically, the S/D raised layers 106A, 106B. The S/D contacts 140 can be formed using known metallization techniques. For example, in embodiments of the invention, trenches can be formed in the passivation region 130, and the S/D contacts 140 can be deposited into the trenches.

The S/D contacts 140 can be made of any suitable conducting material, such as, for example, metal (e.g., chromium, tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In embodiments of the invention, the S/D contacts 140 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

According to embodiments of the invention, the S/D raised layers 106A, 106B are formed along top surfaces and sidewalls of the LTPS S/D regions 104A, 104B. In some embodiments of the invention, the S/D raised layers 106A, 106B are faceted. In some embodiments of the invention, the S/D raised layers 106A, 106B are not faceted. In embodiments of the invention, the S/D raised layers 106A, 106B are formed selectively on the exposed surfaces of the LTPS S/D regions 104A, 104B (and therefore self-aligned to the gate stack 120) using an epitaxial growth process (e.g., PECVD) that results in crystalline growth on the exposed surfaces of the LTPS S/D regions 104A, 104B and in non-crystalline growth elsewhere; followed by selective removal of the non-crystalline portion, leaving behind the crystalline portion of the grown material. The S/D raised layers 106A, 106B can include highly doped silicon grown at temperatures as low as about 150° C. In embodiments of the invention where the S/D regions 104A and 104B are formed from a poly-crystalline material such as LTPS, the S/D raised layers 106A and 106B are also poly-crystalline due to the epitaxial nature of the growth process. However, in embodiments of the invention where the S/D regions 104A and 104B are formed from a single-crystalline material, the S/D raised layers 106A and 106B can also be single-crystalline. The non-crystalline portion can be amorphous, nano-crystalline, micro-crystalline or a combination thereof. The raised S/D formation process is selective in that the S/D raised layers 106A, 106B are formed on predetermined areas of the TFT device 100A. In embodiments of the invention, the predetermined areas of the TFT device 100A include areas where crystalline silicon (c-Si) is exposed. In embodiments of the invention, the predetermined areas where c-Si is exposed include top surfaces and sidewalls of the LTPS S/D regions 104A, 104B. The S/D drain formation process is self-aligning in that the selective formation features of the process enables the S/D raised layers 106A, 106B to be substantially self-aligned to the gate stack 120 without the use of spacers or additional masking operations.

In embodiments of the invention, the epitaxial growth of silicon is performed in a hydrogen diluted silane environment using a PECVD process. In embodiments of the invention, the gas ratio of hydrogen gas to silane gas ($[H_2]/[SiH_4]$) can be between about 5 and about 1000. In embodiments of the invention, the epitaxial growth of silicon begins at a gas ratio of about 5 to about 10. In embodiments of the invention, the quality of the epitaxial growth can be improved by increasing the hydrogen dilution ratio, for example, to about 5:1 or greater. Dopants can be introduced into the film by including dopant gases in the gas mixture during growth. Examples of dopant gases used for n-type doping include phosphine, $PH_3$ and arsine, $AsH_3$. Examples of dopant gases used for p-type doping include diborane, $B_2H_6$ and trimethylborane, $B(CH_3)_3$, also known as TMB.

Epitaxial silicon can be grown using various gas sources, e.g., silane ($SiH_4$), dichlorosilane (DCS), $SiF_4$, $SiCl_4$ or the like. The quality of epitaxial silicon can be improved by increasing the dilution of hydrogen using these or other gases. For higher hydrogen dilution, smoother interfaces were produced (epitaxial silicon to crystalline silicon) and fewer stacking faults and other defects were observed. The epitaxial Si can include other elements including but not limited to Ge, C, O, N, F and Cl. The hydrogen content of the epitaxial Si can be in the range of about 5 to about 40 atomic percent. Therefore, the epitaxial Si grown in this manner can be referred to as hydrogenated crystalline Si, or c-Si:H. In Ge-containing embodiments (i.e., epitaxial SiGe alloys), Ge can be incorporated by including a Ge containing gas source such as germane, $GeH_4$ into the gas mixture such that $[H_2]/([SiH_4]+[GeH_4])$ is between about 5 and about 1000.

Following the epitaxial growth, selective removal of the non-crystalline Si portion can be performed, e.g., using a hydrogen plasma which can be performed "in-situ", i.e., inside the same the reactor used for the epitaxial growth of Si. The hydrogen plasma etch that can be performed at a temperature of from room temperature (e.g., about 20° C.) to about 500° C. and at a hydrogen pressure from about 10 mtorr to about 5 torr. In some embodiments of the invention, the hydrogen plasma etch is performed at a temperature of from about 100° C. to about 250° C. and at a hydrogen pressure from about 10 mtorr to 1 about torr. The hydrogen plasma etch can be performed utilizing one of hydrogen or HCl as a source of the hydrogen plasma. In some embodiments of the invention, the etch selectivity for removing the non-crystalline portions relative to the material for the crystalline portion is from about 2:1 to about 10:1. In some embodiments of the invention, the hydrogen plasma serves an additional benefit of improving the crystalline quality (e.g. increasing the crystallinity) of the crystalline portion. In some embodiments, the removal of the non-crystalline portion relative to the material for the crystalline portion can be performed using other types of plasmas besides hydrogen plasma including, for example, $Cl_2$ or Ar. In embodiments of the invention, the epitaxial growth of silicon in a hydrogen diluted silane environment can be performed using radio-frequency (RF) or direct current (DC) plasma enhanced chemical vapor deposition (CVD) performed at deposition temperature ranges from about room temperature to about 500° C., and in some embodiments of the invention from about 150° C. to about 250° C. Plasma power density can range from about 2 mW/cm$^2$ to about 2000 mW/cm$^2$. A deposition pressure range can be from about 10 mtorr to about 5 torr. Other growth techniques such as hot-wire chemical vapor deposition (HWCVD) can also be used.

In embodiments of the invention, high dopant activation (e.g. larger than about $10^{20}$ cm$^{-3}$) can be obtained at temperatures as low as 150° C. The low-temperature epitaxial Si can be grown on different semiconductor materials, such as Si, Ge, and III-Vs. For example, an epitaxial silicon layer was grown by the present inventors on GaAs at about 200° C. in accordance with embodiments of the invention. Additional details of the epitaxial growth and selective etching process according to embodiments of the invention are depicted in FIGS. 5A-9 and described subsequently in this detailed description.

Figure 2:
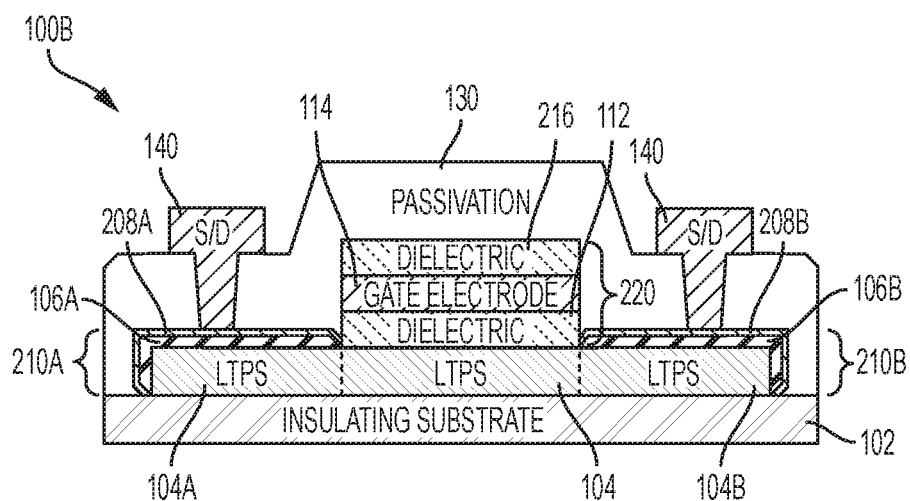
FIG. 2 depicts a cross-sectional view of a self-aligned, spacerless TFT according to embodiments of the invention.

FIG. 2 depicts a cross-sectional view of the self-aligned, spacerless TFT device 100B having an insulating substrate 102, a LTPS channel region 104, S/D regions 210A, 210B, a gate stack 220, a passivation region 130, and S/D contacts 140, configured and arranged as shown. The TFT device 100B is identical to the TFT device 100A (shown in FIG. 1) except for the structure of the S/D regions 210A, 210B and the gate stack 220. In embodiments of the invention, the S/D regions 210A, 210B include LTPS S/D regions 104A, 104B, S/D raised layers 106A, 106B, and S/D silicide layers 208A, 208B, configured and arranged as shown. In embodiments of the invention, the gate stack 220 includes a bottom gate dielectric region 112, a conducting gate electrode region 114, and a top gate dielectric 216, configured and arranged as shown. In embodiments of the invention, the top gate dielectric 216 is provided to protect the conducting gate electrode region 114 against conventionally used wet cleaning and/or HF dip steps that can be used (e.g. for removing organic residues from lithography and/or native/chemical oxide layers, etc., as known in the art).

According to embodiments of the invention, the S/D silicide layers 208A, 208B are formed along top surfaces and sidewalls of the S/D raised layers 106A, 106B. In some embodiments of the invention, the S/D silicide layers 208A, 208B are faceted. In some embodiments of the invention, the S/D silicide layers 208A, 208B are not faceted. In embodiments of the invention, the S/D silicide layers 208A, 208B are formed using a selective and self-aligning process in which a blanket metal layer 802 (shown in FIG. 8) is deposited using techniques known in the art, including such as thermal evaporation, e-beam evaporation, sputtering, CVD, ALD and electrodeposition. The blanket metal layer 802 can be conformal as illustrated schematically in FIG. 8 or can be non-conformal in other embodiments of the invention. The blanket metal layer 802 can include any suitable element for forming a silicide when annealed in contact with silicon, for example, chromium (Cr), nickel (Ni), titanium (Ti), or platinum (Pt).

In embodiments of the invention, the metal layer 802 can be annealed to form silicide by reacting with c-Si:H, i.e., the material forming the S/D raised layers 106A, 106B. As a result, the S/D silicide layers 208A, 208B are formed on the S/D raised layers 106A, 106B. In other words, portions of the conformal liner 802 and the S/D raised layers 106A, 106B react during the annealing process to form the S/D silicide layers 208A, 208B. In contrast, no reaction takes place where the portions of the metal layer 802 are in contact the substrate 102 and the gate stack 220. The unreacted portion of the metal layer 802 is then selectively removed, e.g., using a suitable wet etch, leaving behind the silicide layers 208A, 208B. Any suitable annealing process known for forming silicides can be used, such as, for example, a RTA, spike annealing, flash lamp annealing, laser annealing or furnace annealing. In one example, annealing is performed at a temperature from about 100° C. to about 200° C. for a duration of, for example, from about 5 to about 15 minutes. In this manner, silicide formation can be confined to the exposed surfaces of the S/D raised layers 106A, 106B such that the S/D silicide layers 208A, 208B are "self-aligned" to the S/D raised layers 106A, 106B and therefore also "self-aligned" to the gate stack 220. In embodiments of the invention, the chemical reaction between metal and c-Si:H is facilitated by using a substrate temperature above room temperature during metal deposition. In embodiments of the invention, no heating or annealing is used.

Figure 8:
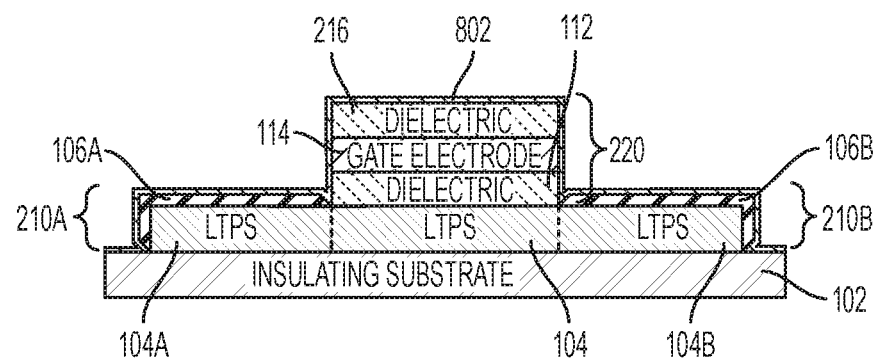
Figure 9:
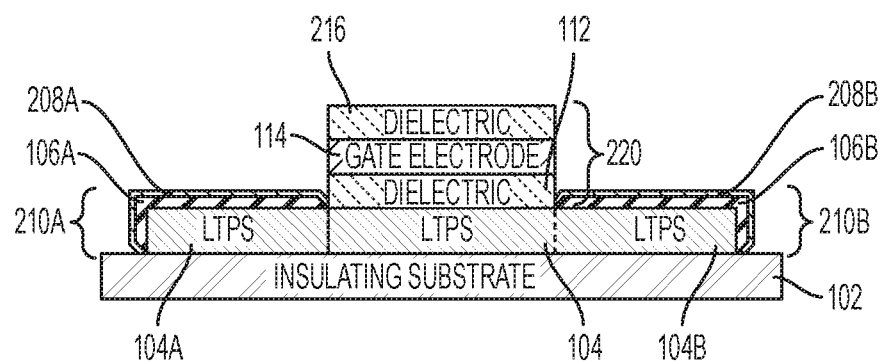

The unreacted portion of the metal layer 802 (including the portion in contact with exposed surfaces of the substrate 102 and the gate stack 220) can be stripped from the TFT device 100B using any suitable process known for removing unreacted metals following a silicidation. In embodiments of the invention, a wet or dry etch process can be used. In embodiments of the invention, the metal layer 802 is formed from Ti, and the unreacted portions of the metal layer 802 are removed using an ammonium hydroxide ($NH_4OH$) etch. In embodiments of the invention, the metal layer 802 can include Co or Ni, and the unreacted portions of the metal layer 802 are removed using a hydrochloric acid (HCl) etch, which can include a mixture of hydrochloric acid, hydrogen peroxide ($H_2O_2$), sulfuric acid ($H_2SO_4$), and deionized water. In embodiments of the invention, unreacted Co or Ni can be exposed to a plasma containing carbon monoxide gas that removes the unreacted portions of the metal layer 802. In embodiments of the invention where the metal layer 802 is includes Cr, the selective removal is performed in a solution of ceric ammonium nitrate ($Ce(NH_4)_2(NO_3)_6$) and an acid such as perchloric acid ($HClO_4$) or nitric acid ($HNO_3$) in deionized water. In embodiments of the invention, the selective removal of the unreacted portion of the blanket metal layer 802 is facilitated by the poor adhesion of metal to dielectric 112 and/or insulating substrate 102. Additional details of the selective and self-aligning silicide formation process according to embodiments of the invention are depicted in FIGS. 8 and 9 and described subsequently in this detailed description.

Figure 3:
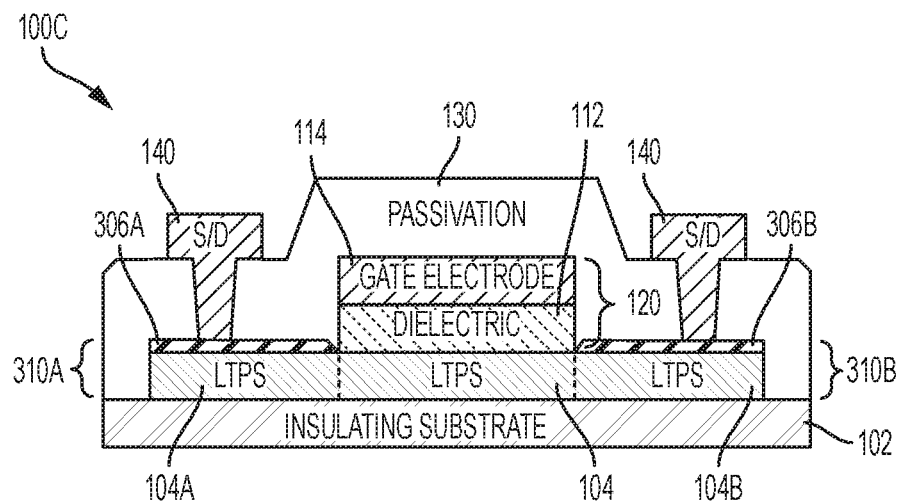
FIG. 3 depicts a cross-sectional view of a self-aligned, spacerless TFT according to embodiments of the invention.

FIG. 3 depicts a cross-sectional view of the self-aligned, spacerless TFT device 100C having an insulating substrate 102, a LTPS channel region 104, S/D regions 310A, 310B, a gate stack 120, a passivation region 130, and S/D contacts 140, configured and arranged as shown. The TFT device 100C is identical to the TFT device 100A (shown in FIG. 1) except for the structure of the S/D regions 310A, 310B. In embodiments of the invention, the S/D regions 310A, 310B include LTPS S/D regions 104A, 104B and S/D raised layers 306A, 306B, configured and arranged as shown. More specifically, unlike the S/D raised layers 106A, 106B (shown in FIG. 1), the S/D raised layers 306A, 306B are disposed over top surfaces of the LTPS S/D regions 104A, 104B but not along sidewalls of the LTPS S/D regions 104A, 104B. The TFT device 100C can be fabricated using the same process as that for the TFT device 100A except that the semiconductor active regions of the TFT device 100C are defined (i.e., isolated) after the formation of the raised S/D regions 306A, 306B whereas the semiconductor active regions of the TFT device 100A are defined (i.e., isolated) after the formation of the raised S/D regions 106A, 106B.

Figure 4:
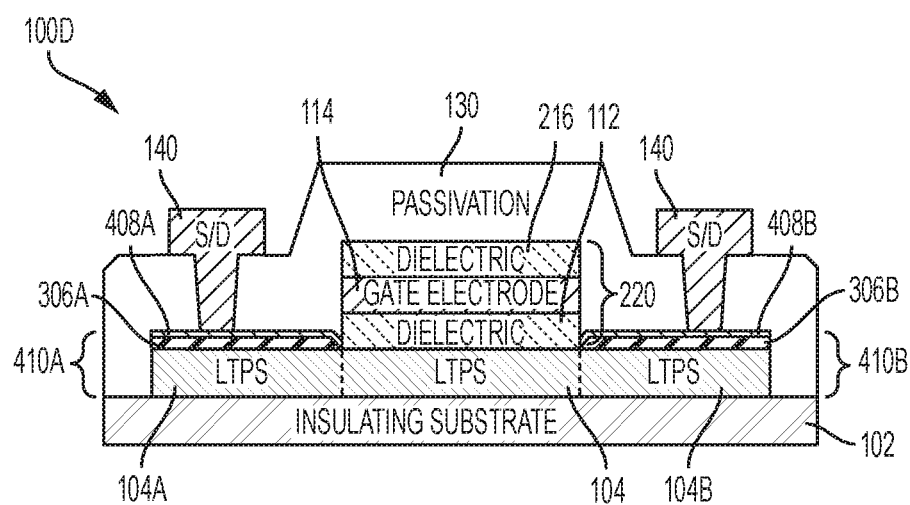
FIG. 4 depicts a cross-sectional view of a self-aligned, spacerless TFT according to embodiments of the invention.

FIG. 4 depicts a cross-sectional view of the self-aligned, spacerless TFT device 100D having an insulating substrate 102, a LTPS channel region 104, S/D regions 410A, 410B, a gate stack 220, a passivation region 130, and S/D contacts 140, configured and arranged as shown. The TFT device 100D is identical to the TFT device 100B (shown in FIG. 2) except for the structure of the S/D regions 410A, 410B. In embodiments of the invention, the S/D regions 410A, 410B include LTPS S/D regions 104A, 104B, S/D raised layers 306A, 306B, and S/D silicide layers 408A, 408B, configured and arranged as shown. The TFT device 100D can be fabricated using the same process as that for the TFT device 100B except that the semiconductor active regions of the TFT device 100D are defined (i.e., isolated) after the formation of the raised S/D regions 306A, 306B and silicide layers 408A, 408B; whereas the semiconductor active regions of the TFT device 100B are defined (i.e., isolated) after the formation of the raised S/D regions 106A, 106B and silicide layers 208A, 208B.

Figure 5A:
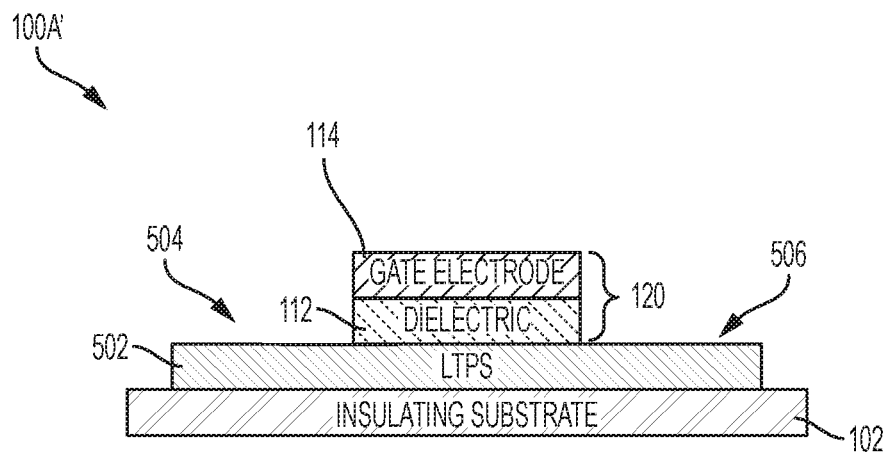

FIGS. 5A-9 each depict a cross-sectional view of a TFT device after a fabrication stage according to embodiments of the invention. More specifically, FIG. 5A depicts a cross-sectional view of a self-aligned, spacerless TFT device 100A' after fabrication operations according to embodiments of the invention. When completed, the final structured of the TFT device 100A' will be the TFT device 100A shown in FIG. 1.

Referring now to FIG. 5A, conventional semiconductor device fabrication processes have been used to form the TFT device 100A' having the insulating substrate 102, an LTPS region 502, and the gate stack 120, configured and arranged as shown. In embodiments of the invention, the gate stack 120 includes the gate dielectric region 112 and the conducting gate electrode region 114, configured and arranged as shown.

The starting structure of the TFT device 100A' is a layer of LTPS formed over the insulating substrate 102. In embodiments of the invention, the insulating substrate 102 can be glass, plastic, buried oxide, and the like. In some embodiments of the invention, the substrate 102 can be a bulk monocrystalline silicon substrate, an extremely thin SOI (ETSOI) substrate, a partially-depleted SOI (PDSOI) substrate or other suitable substrates. In addition to silicon, suitable semiconductor and/or substrate materials include Ge, III-V semiconductors (e.g., GaAs), and the like. In embodiments of the invention, the layer of LTPS can be prepared by excimer laser crystallization. The layer of LTPS can be patterned to form the LTPS region 502. The layer of LTPS can be patterned by lithography using a dry etch (such as a $CF_4$ plasma or a $SF_6/O_2$ plasma) or a wet-etch (such as TMAH). As known in the art, etching with TMAH can require a hard mask such as a dielectric (not shown) because TMAH can attack some types of photoresist. The gate stack 120 is formed over a portion of the exposed top surface of the LTPS region 502 using known fabrication techniques, thereby leaving a first surface 504 and a second surface 506 of the LTPS region 502 exposed.

Figure 5B:
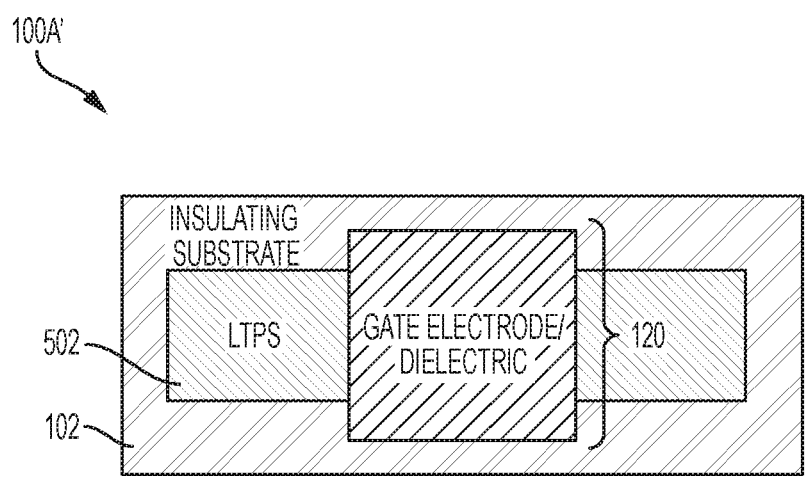
FIG. 5B depicts a top-down view of the self-aligned, spacerless TFT shown in FIG. 5A.

FIG. 5B depicts a top-down view of the self-aligned, spacerless TFT device 100A' shown in FIG. 5A. As shown in FIG. 5B, the gate stack 120 is formed such that it extends over portions of the LTPS region 502. This prevents c-Si:H growth on sidewall portions of the LTPS region 502 which are covered by the gate stack. If c-Si:H were allowed to grow on the aforementioned sidewall portions of the LTPS region 502, an unwanted electrical path parallel to the LTPS channel region 104 would be created.

Figure 6:
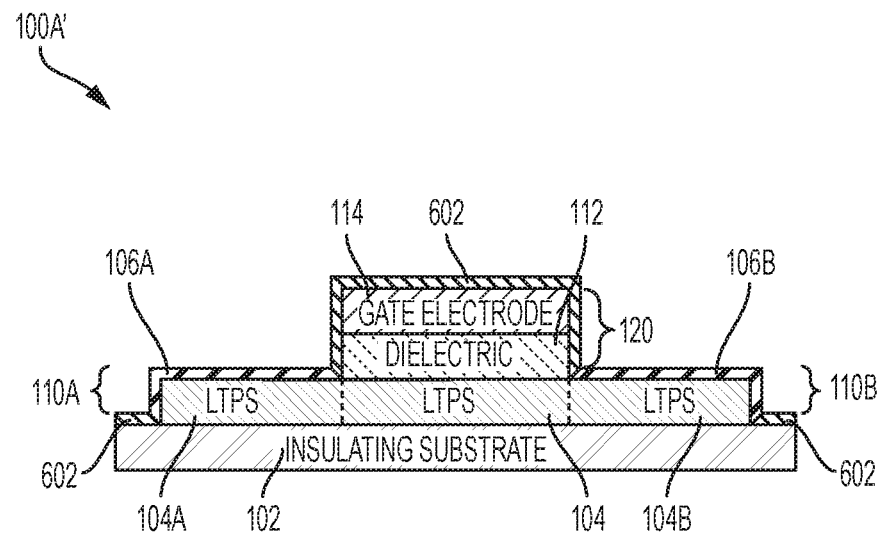

In FIG. 6, hydrogenated Si (Si:H) (non-crystalline Si:H layers 602 and c-Si:H S/D raised layers 106A, 106B) has been grown over exposed surfaces of the insulating substrate 102, the LTPS region 502, and the gate stack 120. The Si:H can be epitaxially grown using, for example, PECVD. Other techniques such as hot-wire chemical vapor deposition (HWCVD) can also be used. This results in crystalline (single or poly) growth on the exposed parts on the LTPS region 502 (e.g., the first and second exposed surfaces 504, 506 shown in FIG. 5A), and further results in non-crystalline growth elsewhere (e.g., on exposed portions of the insulating substrate 102 and the gate stack 120).

Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The active dopant concentration in the source/drain can range from $1 \times 10^{19}$ cm$^{-3}$ to $2 \times 10^{21}$ cm$^{-3}$, but lesser or greater active dopant concentration can also be used. The total dopant concentration in the source/drain can range from $2 \times 10^{20}$ cm$^{-3}$ to $2 \times 10^{21}$ cm$^{-3}$, but lesser or greater total dopant concentration can also be used.

The terms "epitaxial growth and/or deposition" and "epitaxially formed and/or grown" mean the growth of a semiconductor material (crystalline material) on a deposition surface of another semiconductor material (crystalline material) in which the semiconductor material being grown (crystalline overlayer) has substantially the same crystalline characteristics as the semiconductor material of the deposition surface (seed material). In other words, the semiconductor material grown on a non-crystalline surface such as silicon dioxide or silicon nitride is non-crystalline, and the semiconductor material grown on a crystalline surface is crystalline following the crystalline structure of the aforementioned surface. For example, a semiconductor material epitaxially grown on a <100> orientated crystalline surface can take on a <100> orientation.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 7:
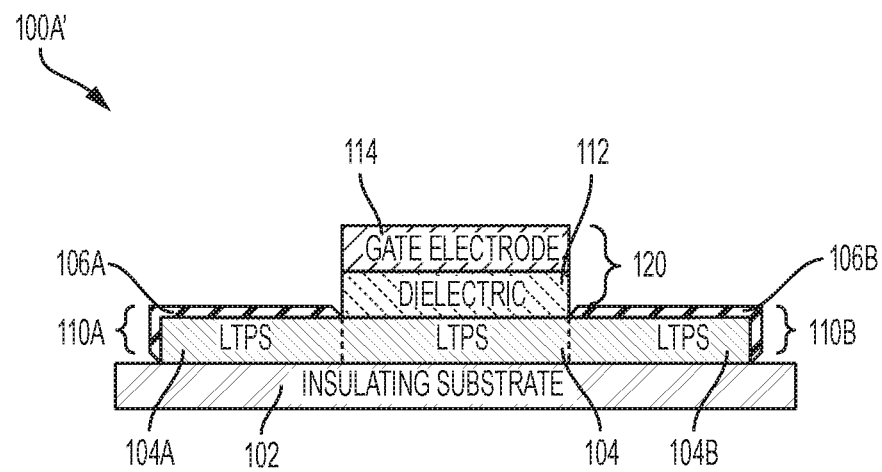

In FIG. 7, the non-crystalline portion of the epitaxially grown Si:H (non-crystalline Si:H layers 602) has been removed selectively using an appropriate dry or wet etch. In embodiments of the invention, etching can be performed in-situ using a $H_2$ plasma, leaving behind the crystalline portion (c-Si:H raised S/D layers 106A/106B), as explained previously herein. Conventional semiconductor device fabrication techniques can be used to form the passivation region 130 and the S/D contacts 140, thereby resulting in the TFT device 100A shown in FIG. 1.

FIGS. 8 and 9 depict cross-sectional views of a self-aligned, spacerless TFT 100B' after fabrication operations according to embodiments of the invention. When completed, the final structured of the TFT device 100B' will be the TFT device 100B shown in FIG. 2. As shown in FIG. 8, the S/D silicide layers 208A, 208B (shown in FIG. 9) are formed using a selective and self-aligning process in which the blanket metal layer 802 is deposited over exposed surfaces of the substrate 102, the S/D raised layers 106A, 106B, and the gate stack 220. The blanket metal layer 802 can include any elements suitable for forming a silicide when annealed in contact with silicon. In embodiments of the invention, the blanket metal layer 802 can be formed from, for example, chromium (Cr), nickel (Ni), titanium (Ti), or platinum (Pt). The blanket metal layer 802 can be formed using, for example, CVD, PECVD, ALD, flowable CVD, or PVD.

In embodiments of the invention, the blanket metal layer 802 can be annealed to form both sacrificial silicide regions (not shown) and the S/D silicide layers 208A, 208B (shown in FIG. 9). During the annealing process, the S/D silicide layers 208A, 208B are formed where portions of the blanket metal layer 802 contact a surface of the S/D raised layers 106A, 106B. In other words, during the anneal, portions of the blanket metal layer 802 reacts with the c-Si:H in the S/D raised layers 106A, 106B to form the S/D silicide layers 208A, 208B. In a similar manner, the sacrificial silicide regions are formed where portions of the blanket metal layer 802 contact the substrate 102 and the gate stack 220. Any suitable annealing process known for forming silicides can be used, such as, for example, a RTA, spike annealing, flash lamp annealing, laser annealing or furnace annealing. In one example, annealing is performed at a temperature from about 100° C. to about 200° C. for a duration of, for example, from about 5 to about 15 minutes. In this manner, silicide formation can be confined to the exposed surfaces of the S/D raised layers 106A, 106B such that the S/D silicide layers 208A, 208B are "self-aligned" to the S/D raised layers 106A, 106B and therefore are also self-aligned to the gate stack 220. In embodiments of the invention, the chemical reaction between metal and c-Si:H is facilitated by using a substrate temperature above room temperature during metal deposition. In embodiments of the invention, no heating or annealing is used.

In FIG. 9, the unreacted blanket metal layer 802 (including the portion in contact with exposed surfaces of the substrate 102 and the gate stack 220) have been stripped from the TFT device 100B' using any suitable process known for removing unreacted metals following a silicidation. In embodiments of the invention, a wet or dry etch process can be used. In embodiments of the invention, the blanket metal layer 802 includes Ti, and the unreacted portions of the blanket metal layer 802 are removed using an ammonium hydroxide ($NH_4OH$) etch. In embodiments of the invention, the blanket metal layer 802 can includes Co or Ni, and the unreacted portions of the blanket metal layer 802 are removed using a hydrochloric acid (HCl) etch, which can include a mixture of hydrochloric acid, hydrogen peroxide ($H_2O_2$), sulfuric acid ($H_2SO_4$), and deionized water. In embodiments of the invention, unreacted Co or Ni can be exposed to a plasma containing carbon monoxide gas that removes the unreacted portions of the blanket metal layer 802. In embodiments of the invention where the metal layer 802 is includes Cr, the selective removal is performed in a solution of ceric ammonium nitrate ($Ce(NH_4)_2(NO_3)_6$) and an acid such as perchloric acid ($HClO_4$) or nitric acid ($HNO_3$) in deionized water. In embodiments of the invention, the selective removal of the unreacted portion of the blanket metal layer 802 is facilitated by the poor adhesion of metal to dielectric 112 and/or insulating substrate 102. Additional details of the selective and self-aligning silicide formation process according to embodiments of the invention are depicted in FIGS. 8 and 9 and described subsequently in this detailed description.

Figure 10:
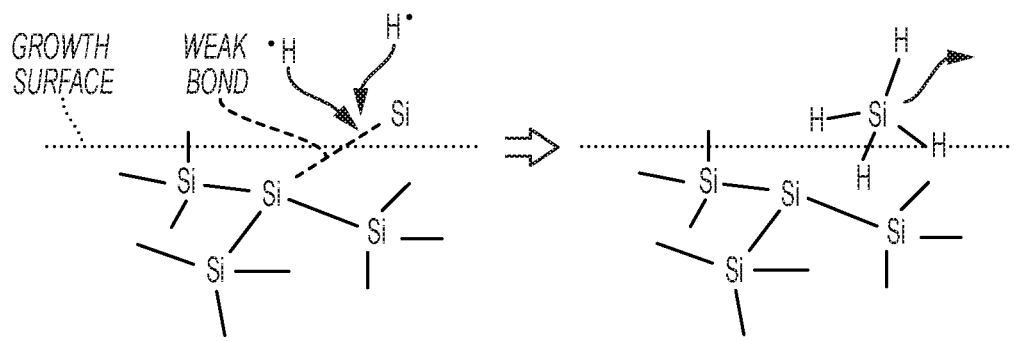
FIG. 10 depicts a diagram illustrating chemical bonds formed when growing a hydrogenated, doped, and/or self-aligned epitaxial layer of a self-aligned, spacerless TFT according to embodiments of the invention.

FIG. 10 depicts a diagram illustrating chemical bonds formed when epitaxially growing a low-temperature hydrogenated crystalline Si layer according to embodiments of the invention. The parameters of the hydrogenation system (not shown) are set such that, as depicted, the hydrogen radicals present in the gas mixture selectively remove the weak Si—Si bonds formed on the growth surface (which would otherwise result in non-crystalline growth), thus resulting in a Si film that has substantially the same crystalline characteristics (i.e. strong Si—Si bonds) as the underlying crystalline Si substrate. It will be appreciated that, even though the dopant atoms are not explicitly illustrated in the diagram of FIG. 10, a portion of the Si atoms in a doped material are substituted with dopant atoms (e.g. P or B).

Figure 11A:
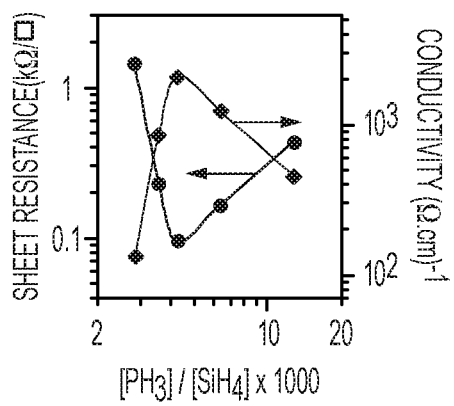
FIG. 11A depicts a diagram illustrating a plot of sheet resistance vs. conductivity for various dopant/precursor gas ratio values (e.g., [PH3]/[SiH4]×1000) according to embodiments of the invention.

FIG. 11A depicts a diagram illustrating a plot of sheet resistance and conductivity vs. the dopant/precursor gas ratio of $[PH_3]/[SiH_4] \times 1000$ at a growth temperature of about 150° C., according to embodiments of the invention. In the example shown in FIG. 11A, sheet resistance was measured using a four-point probe and the corresponding conductivity was calculated from the measured sheet resistance. More specifically, sheet resistivity of phosphorus doped epitaxial c-Si:H for various $PH_3$ gas flows is shown. Sheet resistivity for about 50 nm thick epitaxial c-Si:H doped for various $PH_3$ gas flows indicates high dopant activation in silicon despite the low growth temperature of about 150° C. The plotted line pointing to the left axis shows sheet resistance, and the line pointing to the right axis shows conductivity. As will be appreciated by persons skilled in the relevant art, the diagram in FIG. 11A is in a format that is, in effect, two plots combined on a single plot, and the two Y-axes (e.g., y1 and y2) share the same x-axis.

Figure 11B:
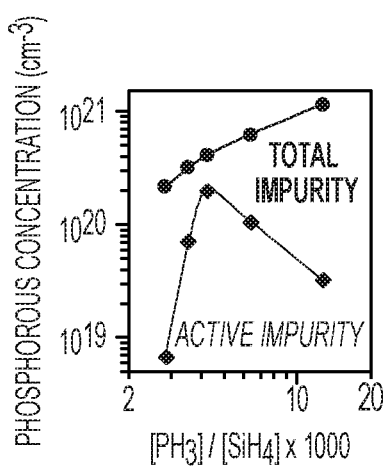
FIG. 11B depicts a diagram illustrating a plot of phosphorous concentration vs. various dopant/precursor gas ratio values (e.g., [PH3]/[SiH4]×1000) showing the "total impurity" and "active impurity" lines according to embodiments of the invention.

FIG. 11B depicts a diagram illustrating a plot of phosphorous concentration vs. the dopant/precursor gas ratio of $[PH_3]/[SiH_4] \times 1000$) showing the "total impurity" and "active impurity" lines according to embodiments of the invention. In the example shown in FIG. 11B, the total impurity was measured by secondary ion mass spectrometry (SIMS). The active impurity was calculated from the measured sheet resistance plotted in FIG. 11A. As observed from the plot, active doping concentration as high as $2 \times 10^{20}$ cm$^{-3}$ was achieved at growth temperatures as low as 150° C.

Figure 12A:
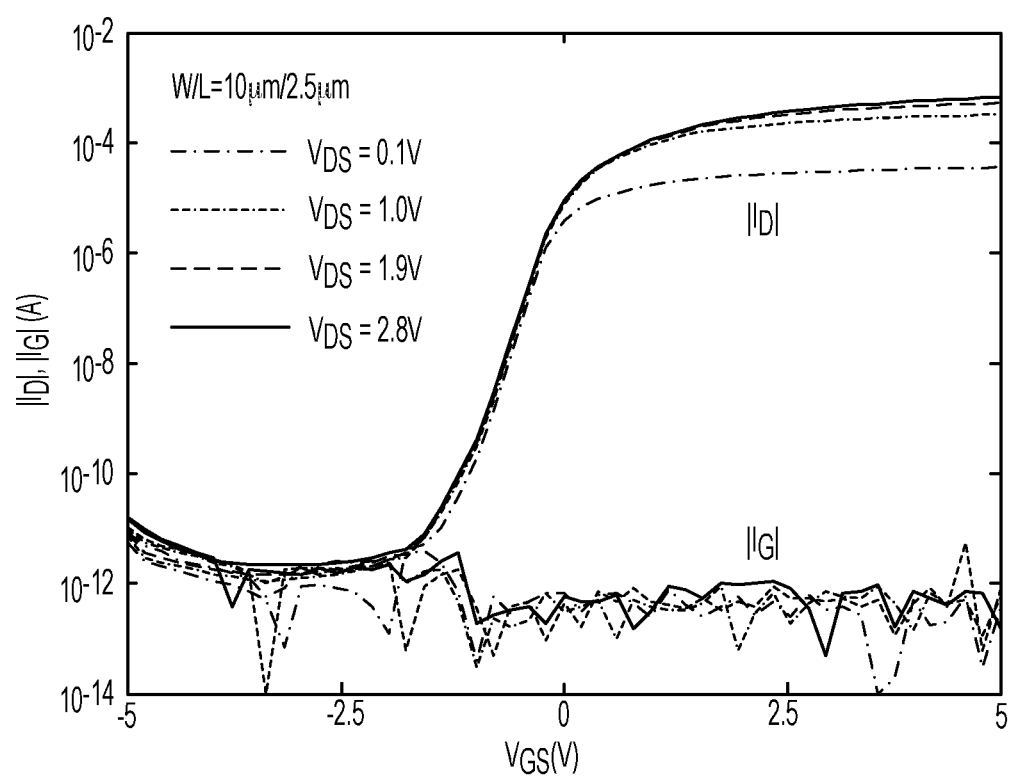
FIG. 12A depicts measured transfer characteristics of a fabricated spacer-less self-aligned TFT according to aspects of the invention as depicted in FIG. 1.
Figure 12B:
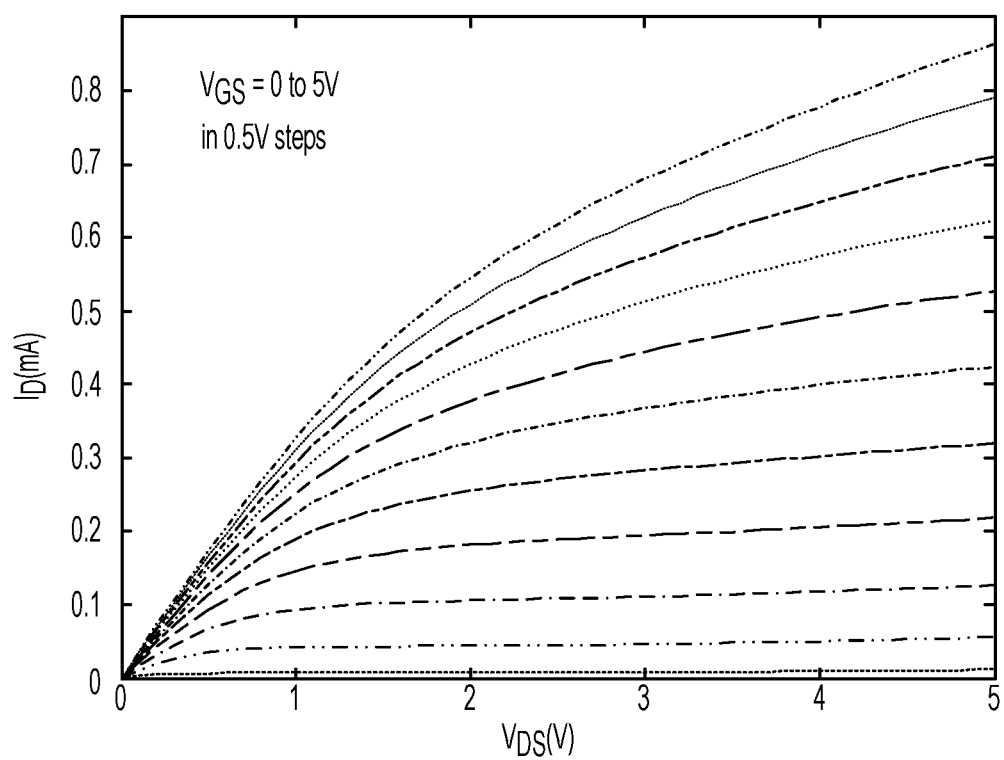
FIG. 12B depicts output characteristics of a fabricated spacer-less self-aligned TFT according to aspects of the invention as depicted in FIG. 1.

The measured transfer characteristics and output characteristics of a fabricated spacer-less self-aligned TFT according to aspects of the invention depicted in FIG. 1 are plotted in FIGS. 12A and 12B. In the example reflected in FIGS. 12A and 12B, the semiconductor substrate 104 (LTPS channel region 104 shown in FIG. 1) of the fabricated TFT includes undoped single-crystalline Si having a thickness of about 30 nm, and the insulating substrate 102 of the fabricated TFT is comprised of buried oxide. In the example reflected in FIGS. 12A and 12B, the fabricated TFT has a channel width-to-length ratio (W/L) of 10 µm/2.5 µm. The transfer characteristics of FIG. 12A are plots of the absolute values of the drain current and gate current ($|I_D|$ and $|I_G|$, respectively) vs. the gate-to-source voltage ($V_{GS}$) for drain-to-source voltage ($V_{DS}$) values of 0.1V, 1.0V, 1.9V and 2.8V. An effective low-field linear field-effect mobility of approximately 500 cm$^2$/Vs can be extracted from the transfer characteristics.

The output characteristics of FIG. 12B are plots of the drain current ($I_D$) vs. drain-to-source voltage ($V_{DS}$) for various values of the gate-to-source voltage ($V_{GS}$) ranging from 0 to 5V in 0.5V steps. The observed Early effect in the output characteristics are due to channel length modulation and are expected because the semiconductor substrate (LTPS channel region 104 shown in FIG. 1) is undoped. No kink effect is observed in the output characteristics, which demonstrates the effectiveness of the novel structures and methods described herein in eliminating the adverse effects of high electric fields at the drain.

The methods and resulting structures described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage.

By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a semiconductor layer within or on a portion of a substrate, wherein the semiconductor layer comprises a first type of semiconductor material;
   forming a gate stack over a first exposed surface of the semiconductor layer, wherein a portion of the semiconductor layer that is under the gate stack comprises a channel region of the semiconductor device;
   forming a first hydrogenated and doped semiconductor layer over a second exposed surface of the semiconductor layer, wherein the first hydrogenated and doped semiconductor layer and a portion of the semiconductor layer that is under the first hydrogenated and doped semiconductor layer comprises a source region of the semiconductor device; and
   forming a second hydrogenated and doped semiconductor layer over a third exposed surface of the semiconductor layer, wherein the second hydrogenated and doped semiconductor layer and a portion of the semiconductor layer that is under the second hydrogenated and doped semiconductor layer comprises a drain region of the semiconductor device;
   wherein a lateral dimension of the first hydrogenated and doped semiconductor layer terminates at a first sidewall of the gate stack;
   wherein a lateral dimension of the second hydrogenated and doped semiconductor layer terminates at a second sidewall of the gate stack.

2. The method of claim 1, wherein the substrate is selected from a group consisting of a bulk semiconductor and a semiconductor-on-insulator (SOI) configuration.

3. The method of claim 1, wherein the gate stack comprises a dielectric layer and a gate metal layer.

4. The method of claim 1, wherein the first type of semiconductor material comprises a first type of crystalline semiconductor material.

5. The method of claim 4, wherein the semiconductor device comprises a plurality of exposed surface regions comprising:
   exposed non-crystalline surface regions of the insulating substrate;
   exposed non-crystalline surface regions of the gate stack; and
   exposed crystalline surface regions of the semiconductor layer comprising the first type of crystalline semiconductor material.

6. The method of claim 5, wherein:
   forming the first hydrogenated and doped semiconductor layer or the second hydrogenated and doped semiconductor layer comprises growing a layer of hydrogenated and doped semiconductor material over the plurality of exposed surface regions such that:
      crystalline regions of the layer of hydrogenated and doped semiconductor material are grown over the exposed crystalline surface regions of the semiconductor layer comprising the first type of crystalline semiconductor material;
      non-crystalline regions of the layer of hydrogenated and doped semiconductor material are grown over the exposed non-crystalline surface regions of the insulating substrate; and
      non-crystalline regions of the layer of hydrogenated and doped semiconductor material are grown over the exposed non-crystalline surface regions of the gate stack;
   removing the non-crystalline regions of the layer of hydrogenated and doped semiconductor material;
   the first hydrogenated and doped semiconductor layer comprises a first one of the crystalline regions of the layer of hydrogenated and doped semiconductor material; and
   the second hydrogenated and doped semiconductor layer comprises a second one of the crystalline regions of the layer of hydrogenated and doped semiconductor material.

7. A method of forming a thin-film transistor (TFT) device, the method comprising:
   forming a semiconductor layer within or on a portion of a substrate, wherein the semiconductor layer comprises a first type of crystalline semiconductor material;
   forming a gate stack over a first exposed surface of the semiconductor layer, wherein the gate stack comprises a dielectric layer and a gate metal layer;
   forming a first hydrogenated and doped semiconductor layer over a second exposed surface of the semiconductor layer; and
   forming a second hydrogenated and doped semiconductor layer over a third exposed surface of the semiconductor layer;
   wherein a source region of the TFT device comprises:
      the first hydrogenated and doped semiconductor layer; and
      a first portion of the semiconductor layer that is under the first hydrogenated and doped semiconductor layer;
   wherein a drain region of the TFT device comprises:
      the second hydrogenated and doped semiconductor layer; and
      a second portion of the semiconductor layer that is under the second hydrogenated and doped semiconductor layer;
   wherein a channel region of the TFT device comprises a third portion of the semiconductor layer that is under the gate stack;
   wherein a lateral dimension of the first hydrogenated and doped semiconductor layer terminates at a first sidewall of the gate stack;
   wherein a lateral dimension of the second hydrogenated and doped semiconductor layer terminates at a second sidewall of the gate stack.

8. The method of claim 7, wherein:
   the TFT device comprises a plurality of exposed surface regions comprising exposed non-crystalline surface regions of the insulating substrate, exposed non-crystalline surface regions of the gate stack, and exposed crystalline surface regions of the semiconductor layer; and
   forming the first hydrogenated and doped semiconductor layer or the second hydrogenated and doped semiconductor layer comprises epitaxially growing a layer of hydrogenated and doped semiconductor material over the plurality of exposed surface regions such that:
      crystalline regions of the layer of hydrogenated and doped semiconductor material are epitaxially grown over the exposed crystalline surface regions of the semiconductor layer;
      non-crystalline regions of the layer of hydrogenated and doped semiconductor material are epitaxially grown over the exposed non-crystalline surface regions of the insulating substrate; and non-crystalline regions of the layer of hydrogenated and doped semiconductor material are epitaxially grown over the exposed non-crystalline surface regions of the gate stack.

9. The method of claim 8, wherein:

forming the first hydrogenated and doped semiconductor layer or the second hydrogenated and doped semiconductor layer further comprises removing the non-crystalline regions of the layer of hydrogenated and doped semiconductor material;

the first hydrogenated and doped semiconductor layer comprises a first one of the crystalline regions of the layer of hydrogenated and doped semiconductor material; and the second hydrogenated and doped semiconductor layer comprises a second one of the crystalline regions of the layer of hydrogenated and doped semiconductor material.

10. The method of claim 9, wherein each one of the first hydrogenated and doped semiconductor layer and the second hydrogenated and doped semiconductor layer comprises from about 5 to about 40 atomic percent hydrogen.

11. The method of claim 9, wherein each one of the first hydrogenated and doped semiconductor layer and the second hydrogenated and doped semiconductor layer comprises:

a total doping concentration from about $10^{20}$ cm$^{-3}$ to about $10^{21}$ cm$^3$; and an active doping concentration from about $10^{19}$ cm$^{-3}$ to about $5\times10^{20}$ cm$^3$.

12. The method of claim 9 further comprising growing the layer of hydrogenated and doped semiconductor material from a mixture of carrier gas (e.g. H$_2$), a precursor gas (e.g. SiH$_4$), and a dopant gas (e.g. PH$_3$), wherein a gas flow ratio of the carrier gas over the precursor gas is greater than about 5.

13. The method of claim 9, wherein a substrate temperature during growth of the layer of hydrogenated and doped semiconductor material is in the range of about room temperature to about 450 Celsius degrees, wherein room temperature comprises from about 20 to about 22 Celsius degrees.

14. The method of claim 9 further comprising growing the layer of hydrogenated and doped semiconductor material from a mixture of carrier gas (e.g. H$_2$), a precursor gas (e.g. SiH$_4$), and a dopant gas (e.g. PH$_3$), wherein a gas flow ratio of the dopant gas over the precursor gas is greater than about 1000 parts per million (ppm).

15. The method of claim 9, wherein the non-crystalline regions of the layer of hydrogenated and doped semiconductor material is removed selectively relative to the crystalline regions of the layer of hydrogenated and doped semiconductor material using a hydrogen plasma.

16. The method of claim 9 further comprising:

forming a first silicide layer over the first hydrogenated and doped semiconductor layer; and forming a second silicide layer over the second hydrogenated and doped semiconductor layer;

wherein a lateral dimension of the first silicide layer terminates at the first sidewall of the gate stack;

wherein a lateral dimension of the second silicide layer terminates at the second sidewall of the gate stack.

17. The method of claim 16 further comprising forming the first silicide layer and the second silicide layer at a temperature ranging from about room temperature to about 450 Celsius degrees, wherein room temperature comprises from about 20 to about 22 Celsius degrees.

18. A semiconductor device comprising:

a source region;

a drain region; and a channel region;

a semiconductor layer formed within or on a portion of a substrate, wherein the semiconductor layer comprises a first type of semiconductor material;

a gate stack formed over a first surface of the semiconductor layer;

a first hydrogenated and doped semiconductor layer formed over a second surface of the semiconductor layer; and a second hydrogenated and doped semiconductor layer formed over a third surface of the semiconductor layer;

wherein the source region comprises:

the first hydrogenated and doped semiconductor layer; and a first portion of the semiconductor layer that is under the first hydrogenated and doped semiconductor layer;

wherein the drain region comprises:

the second hydrogenated and doped semiconductor layer; and a second portion of the semiconductor layer that is under the second hydrogenated and doped semiconductor layer;

wherein the channel region comprises a third portion of the semiconductor layer that is under the gate stack;

wherein the gate stack comprises a dielectric layer and a gate metal layer;

wherein a lateral dimension of the first hydrogenated and doped semiconductor layer terminates at a first sidewall of the gate stack;

wherein a lateral dimension of the second hydrogenated and doped semiconductor layer terminates at a second sidewall of the gate stack;

wherein the substrate is selected from a group consisting of a bulk semiconductor and semiconductor-on-insulator (SOI).

19. The semiconductor device of claim 18, wherein:

the first type of semiconductor material comprises a first type of crystalline semiconductor material; and the first hydrogenated and doped semiconductor layer comprises an epitaxially grown, crystalline hydrogenated and doped semiconductor material.

* * * * *